United States Patent [19]
Thylén

[11] Patent Number: 5,367,274
[45] Date of Patent: Nov. 22, 1994

[54] QUANTUM WAVE GUIDING ELECTRONIC SWITCH

[75] Inventor: Lars H. Thylén, Huddinge, Sweden

[73] Assignee: Telefonaktiebolaget L M Ericsson, Stockholm, Sweden

[21] Appl. No.: 906,271

[22] Filed: Jun. 26, 1992

[30] Foreign Application Priority Data

Jun. 28, 1991 [SE] Sweden .............................. 9101988-5

[51] Int. Cl.$^5$ .............................................. H01P 1/15
[52] U.S. Cl. ................................... 333/103; 333/104; 333/262; 257/9; 257/26; 257/29
[58] Field of Search ..................... 333/103, 104, 262; 257/9, 14, 24, 23, 26, 29

[56] References Cited

U.S. PATENT DOCUMENTS

| 4,550,330 | 10/1985 | Fowler | 257/24 |
| 4,633,279 | 12/1986 | Hipwood | 257/29 X |
| 4,942,437 | 7/1990 | Fowler et al. | 257/26 |
| 4,970,563 | 11/1990 | Gaylord | 257/26 |
| 5,105,232 | 4/1992 | de Alamo et al. | 257/24 |
| 5,233,205 | 8/1993 | Usagawa et al. | 257/24 X |

FOREIGN PATENT DOCUMENTS

| 0340779 | 11/1989 | European Pat. Off. . |
| 0357248 | 3/1990 | European Pat. Off. . |
| 0441156 | 8/1991 | European Pat. Off. . |
| 63-93161 | 4/1988 | Japan . |
| 2-3222 | 1/1990 | Japan . |

OTHER PUBLICATIONS

N. Dagli et al., "An Electron Wave Directional coupler and Its Analysis", *J. of Appl. Phys.*, vol. 69, pp. 1047, 1051 (Jan. 15, 1991).
S. Datta, "Quantum Interference Transistors", *Extended Abstracts of the 20th Conf. on Solid State Devices & Materials*, pp. 491–494 (1988).
S. Datta et al., "Electronic Analog of the Electro–Optic Modulator", *Appl. Phys. Lett.*, vol. 56, pp. 665–667 (Feb. 12, 1990).
P. Exner et al., "A New Type of Quantum Interference Transistor", *Phys. Lett. A*, vol. 129, pp. 477–480 (Jun. 13, 1988).
P. Exner et al., "Quantum Interference on Graphs Controlled by an External Electric Field", *J. Phys. A: Math. Gen.*, vol. 21, pp. 4009–4019 (Nov. 7, 1988).
T. Huang et al., "High–Contrast, Large Optical Bandwidth Field–Induced Guide/Antiguide Modulator", *App. Phys. Lett.*, vol. 58, pp. 2211–2213 (May 20, 1991).

(List continued on next page.)

Primary Examiner—Benny Lee
Attorney, Agent, or Firm—Burns, Doane, Swecker & Mathis

[57] ABSTRACT

A quantum wave guiding electronic switch includes a substrate which carries electron waveguides disposed in a fork-like configuration. Each of these electron waveguides is connected to a respective electron reservoir. Electrons are driven through the waveguides by voltage sources. Electrodes on the substrate generate an electric field which passes through the outgoing electron waveguides of the switch, and creates a potential difference therebetween. In one case, in which the electrons are transported ballistically, in the absence of electron scattering, this potential difference creates a phase mismatch between the outputs. An incident electron wave function having even parity is herewith switched to a quasi even electron wave function in the output that has the lowest energetic potential. When transportation is not ballistic and the electrons scattered to some extent, switching is effected by relaxation of incoming electrons to lower energy levels. The electrons will have a higher probability to be conducted through the output that has the lowest potential. The two switching cases may occur simultaneously in part. The switch is digital and requires very little control energy. Electrons within a broad energy range are switched and the switch has small or no losses.

16 Claims, 5 Drawing Sheets

OTHER PUBLICATIONS

S. Kaplan et al., "Mesoscopic Coherence Phenomena in Semiconductor Devices", *IBM J. Res. Develop.*, vol. 32, pp. 347–358 (May 1988).

M. Notomi et al., "Clear Energy Level Shift in Ultranarrow InGaAs/InP Quantum Well Wires Fabricated by Reverse Mesa Chemical Etching", *Appl. Phys. Lett.*, vol. 58, pp. 720–722 (Feb. 18, 1991).

P. Petroff et al., "Novel Approaches in 2 and 3 Dimensional Confinement Structures: Processing and Properties", *Superlattices and Microstructures*, vol. 8, pp. 35–39 (1990).

H. Sakaki, "Exploration of Quantum–Interference and Lateral–Superstructure Devices", *Extended Abstracts of 21st Conf. on Solid State Devices & Materials*, pp. 537–540 (1990).

F. Sols et al., "Criteria for Transistor Action Based on Quantum Interference Phenomena", *Nanostructure Physics and Fabrication*, pp. 157–164, Academic Press, Inc. (1989).

N. Tsukada et al., "Proposal of Novel Electron Wave Coupled Devices", *Appl. Phys. Lett.*, vol. 56, pp. 2527–2529 (Jun. 18, 1990).

QUANTUM WAVE GUIDING ELECTRONIC SWITCH

BACKGROUND

The present invention relates to a wave guiding quantum electronic switch comprising an electron-waveguide carrying substrate;

electrodes located adjacent the electron waveguides and functioning to generate an electric field in the transverse direction of the electron waveguides; and electron reservoirs between which the electron waveguides extend;

wherein the electron waveguides have a transverse extension of the same order of magnitude as a wavelength for an electron-wave function in the electron waveguides.

The function of conventional electronic components, including microelectronic components, is based on the fact that charge transportation is effected by drift and diffusion of charge carriers. This restricts the speed of the components and when applying present-day techniques digital applications have an upper limit of about 5 Gbit/s, at least in the case of more complex functions, such as multiplexing. However, much higher bit rates than this can be achieved with individual components in optical transmission systems. For instance, a bit rate of 100 Gbit/s has been demonstrated for detectors and a bit rate of 40 Gbit/s for modulators. Extremely fast electronic components whose control requires very little energy input can be obtained, however, by utilizing the wave properties of the electrons. These high speed components have an extension of the same order of magnitude as the mean free path of the electrons, which when expressed in terms of wave functions corresponds to the coherence length of the electron wave function. In this case, charge transportation is effected essentially through ballistic transport of the electrons, in other words there is insufficient time for the electrons to be scattered through the component. The term "mesoscopic" has been devised for components of this size, in order to signify that the extension of the components in all directions is smaller than or comparable with the coherence length.

Several mesoscopic components are described in patents and in the technical literature. The Japanese Patent Application No. 63-93161 describes a component in the form of a quantum interferometric Mach-Zehnder interferometer constructed from gallium arsenide. The interferometer has two electron reservoirs between which two electron waveguides extend. Wave functions for electrons which travel in the electron waveguides are influenced by an electric or magnetic field in a manner to cause a phase shift between the wave functions. The wave functions can be caused to interfere with one another in this way and, for instance, to cancel each other out.

A similar mesoscopic interferometer is shown in European Patent Application No. EP 0 357 248. This interferometer, however, has a bandpass filter for the electron wave function, which restricts the electron velocity range and thereby enlargening the modulation depth of the interferometer.

A quantum interferometric transistor is illustrated in a conference contribution by Supriyo Datta: "Quantum Interference Transistors". The contribution is published in Extended Abstracts of the 20th International Conference on Solid State Devices and Materials, Tokyo, 1988, pp. 491–494. The transistor has similarities with a field-effect transistor, but is based on interference between electron wave functions in two parallel electron waveguides. The transistor is controlled with the aid of an electrode which generates an electric field in the electron waveguides and influences the electron wave functions.

A quantum interferometric directional coupler is illustrated in an article in Appl. Phys. Letters, 56(25), 18th June 1990, pp. 2527–2529, by N. Tsukada, et al, "Proposal of Novel Electron Wave Coupled Devices". This directional coupler has two electron waveguides, each of which has an input and an output and both of which are connected to a respective electron reservoir. The electron waveguides are connected in parallel in an interaction zone and interact with one another and the directional coupler is controlled with the aid of electrodes provided in the interaction zone.

The known components described above are based on interference between electron wave functions from separate electron waveguides or from coupling between electron wave functions in separate waveguides. In order to achieve good performance, it is necessary for the electron waveguides to be single-mode waveguides whose extension in the transverse direction of the waveguides is, for instance, from 50 to 100 Å, depending on the bandgap of the materials used. In the case of these components, good performance also demands a unitary electron velocity or, seen in another way, a unitary wavelength of the electron wave function, which is difficult to achieve. The components described above also have an output signal which varies periodically with the strength of an input signal, for instance as illustrated in FIG. 1b of the above-cited Supriyo Datta reference. This places demands on the accuracy of the control signal. Certain of the above-described components also have other drawbacks. One of these drawbacks is found in the manufacture of the quantum interferometric directional couplers, the physical length of which shall be equal to a coupling length. This places such high demands on manufacturing accuracy as to render the manufacture of the direction couplers almost impossible with present-day techniques.

The field of integrated optics also includes components which correspond to the above-described components, for instance optical directional couplers and Mach-Zehnder interferometers. An optical switch having a forked, branched light waveguide is known, a so-called optical digital switch whose function is based on single-mode propagation of a lightwave and not on the interference between separate propagation modes. The mesoscopic components differ from the optoelectrical components in several respects in an obvious way. Mesoscopic components are smaller than optoelectrical components by several orders of magnitude, for instance they have a length of 1 μm as opposed to lengths of 100–1000 μm. Correspondingly, the cross-sectional dimensions of the waveguides are 50 Å and 1 μm respectively. In the case of mesoscopic components, it is electrical currents, electrons, that are controlled and not light, photons, and the signals which control the mesoscopic components are smaller than the signals which control the optoelectrical components by several orders of magnitude. Expressed in the terms of quantum mechanics, one difference is that in the mesoscopic components fermions are controlled and not bosons, as in the case of optical components.

SUMMARY

The present invention relates to a waveguide quantum electronic switch having a forklike or branched electron waveguide and digital response. These waveguides comprise potential depressions in the material in which the electrons can be transported. The switch has at least one input and at least two outputs between which incoming electrons can be switched. In the case of totally ballistic transportation of the electrons, this switching of the incoming electrons is effected by phase mismatch of electron wave functions, with the aid of an external electric field. In those cases where the electrons are scattered to a certain extent, so that electron transportation is not totally ballistic, the switching function is based on the displacement of the potential depressions for the outgoing electron waveguides by the external electric field. In this case, those electrons which are scattered are preferably conducted through the outgoing electron waveguide that has the lowest potential. The switch enables the electron energy to vary relatively widely, and the strength of the control signals can vary widely. It is not necessary for the electron waveguides to be single-mode waveguides in the transverse direction and the waveguides can be given relatively large dimensions in cross-section, especially for a case when a given degree of electron scattering is permitted in the Y-branch. The requirement on manufacturing accuracy is limited. The inventive switch can be said to be an electronic, mesoscopic counterpart of the above-described optical digital switch.

BRIEF DESCRIPTION OF THE DRAWINGS

The invention will now be described in more detail with reference to exemplifying embodiments thereof and with reference to the accompanying drawings, in which.

DETAILED DESCRIPTION

Figure 1:
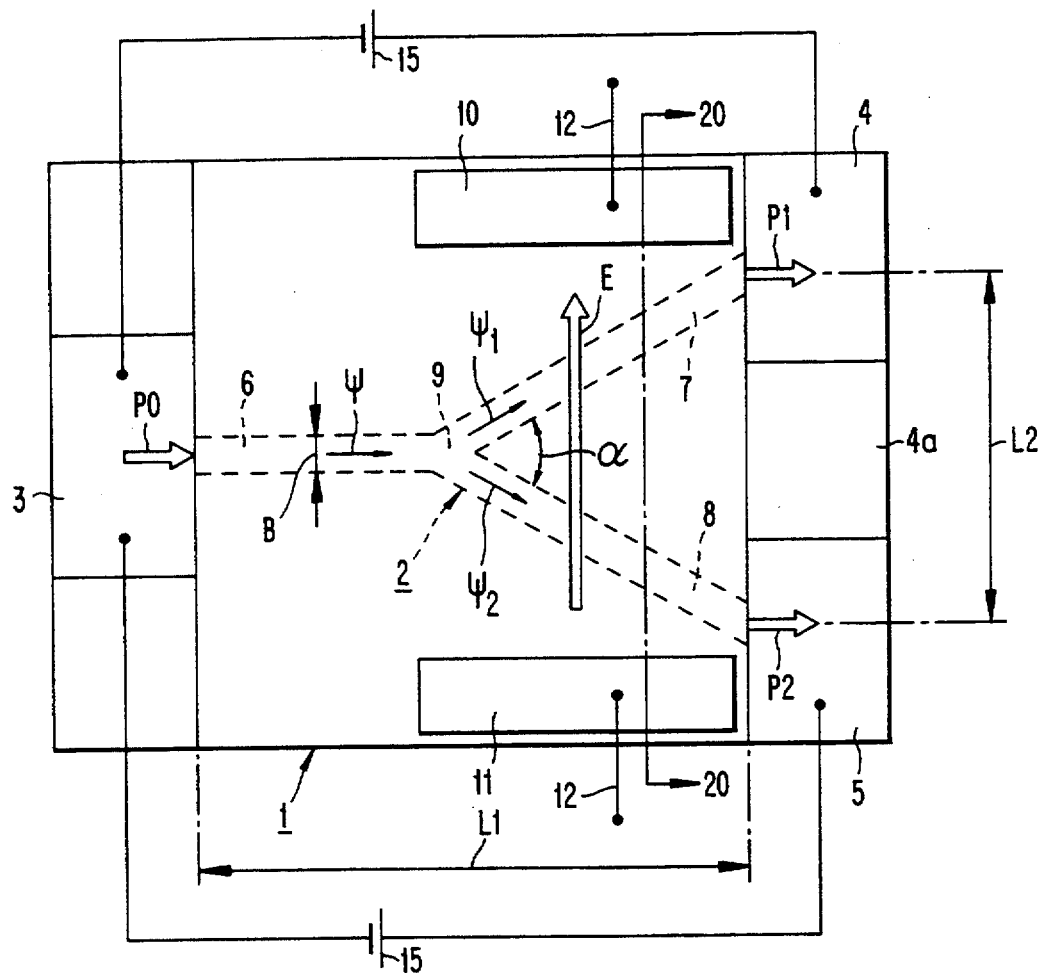
FIG. 1 is a top view of an inventive switch.

An exemplifying embodiment of the inventive quantum wave guiding switch is illustrated in FIG. 1. A substrate 1 made of GaAlAs (gallium aluminum arsenide) carries electron waveguides 2 made of GaAs (gallium arsenide), these waveguides being hidden in the Figure and indicated by broken lines. The electron waveguides 2 extend between electrically isolated electron reservoirs 3, 4 and 5, made of GaAs for instance. The electron waveguides 2 are arranged in a forked configuration with an incoming electron waveguide 6 which is connected to the electron reservoir 3, and two outgoing electron waveguides 7 and 8, each of which is connected to a respective electron reservoir 4 and 5. These two reservoirs are mutually isolated by a region 4a of insulating material. The incoming electron waveguide 6 is connected to the outgoing electron waveguides 7 and 8 in a connection region 9. The switch includes electrodes 10 and 11 which generate an electric field E which extends through the connection region 9 and also through the outgoing electron waveguides 7 and 8. The electrodes are connected electrically through connecting lines 12. The electron reservoirs 3, 4 and 5 are connected to voltage sources 15, which drive electrons through the electron waveguides 2, as illustrated schematically in the Figure. As described below, the incoming electron wave function $\Psi$ has a power $P_0$ which is divided into outgoing wave functions $\Psi_1$, $\Psi_2$ having powers $P_1$, $P_2$, respectively. Thus, there is present an electric field which drives the electrons in the electron waveguides 2 and the electric field E. This electric field E influences the outgoing electron waveguides 7, 8 and the connection region 9, in which switching takes place. A flow of electrons arriving from the reservoir 3, through the incoming electron waveguide 6, is switched to either one of the two outgoing electron waveguides 7 or 8. This function will be explained in more detail below.

Figure 2:
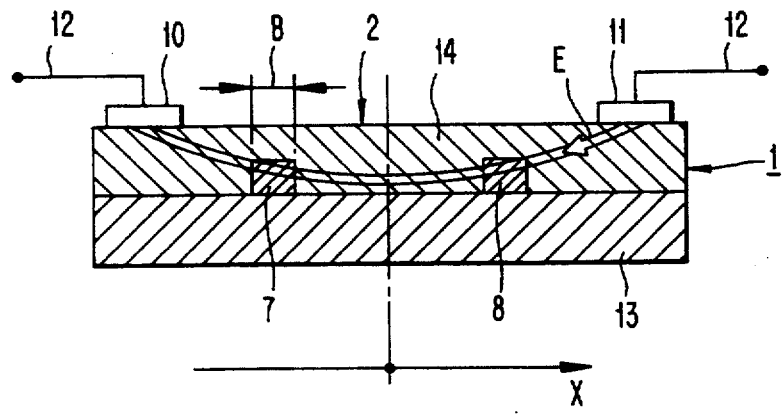
FIG. 2 is a cross-sectional view of the switch shown in FIG. 1.

FIG. 2 is a cross-sectional view of the switch, taken on the line 20—20. The substrate 1 has a bottom layer 13 which supports the waveguides 2, and a top layer 14 which covers the waveguides. The top layer 14 carries the electrodes 10 and 11 which are connected to lines 12 and which generate the electric field E through the electron waveguides 2, including the outgoing waveguide 7, 8.

As before mentioned, it is not necessary for the electron waveguides 2 of the inventive switch to be single-mode waveguides. This is true generally and especially in the case of the embodiment in which scattering of the electrons is permitted. Below this embodiment of the invention is described. In this case, the electron waveguides may be relatively wide, having a width B (see FIGS. 1, 2) of up to, e.g., 1000 Å, which applies for the recited material combination GaAs and GaAlAs. In the case of single-mode operation, it is necessary for the width B to lie, e.g., within the range of 50–500 Å, depending on the manner in which enclosure of the charge carriers is achieved. In this case, the larger the bandgap discontinuity that prevails between the substrate 1 and the electron waveguides 2, the smaller the permitted cross-sectional dimensions of the waveguide for single mode operation. In the case of the aforesaid material combination GaAlAs of high aluminum concentration and GaAs, the cross-sectional dimensions are around 50×50 Å. The switch has an extension L1 (see FIG. 1) within the range of 500–2000 Å in the longitudinal direction of the electron waveguides 2. The lower limit is governed by the fact that the operating voltage of the switch shall be limited and because good switching function with low crosstalk is desired. The upper limit corresponds to the coherence length of the electron wave functions at room temperature. Greater lengths, for instance a length of 1 μm or more, can be used provided that the switch device is cooled. In the case of the switch exemplified in FIG. 1, the electron waveguides 2 have a width B of 50 Å and a length L1 of 2000 Å. The angle α between the two outgoing electron waveguides 7 and 8 is of the order of about 60 degrees, corresponding to a distance L2=1000 Å between the ends of the outgoing electron waveguides 7 and 8. The operating voltage of the voltage sources 15 is about 100 mV.

Figure 3A:
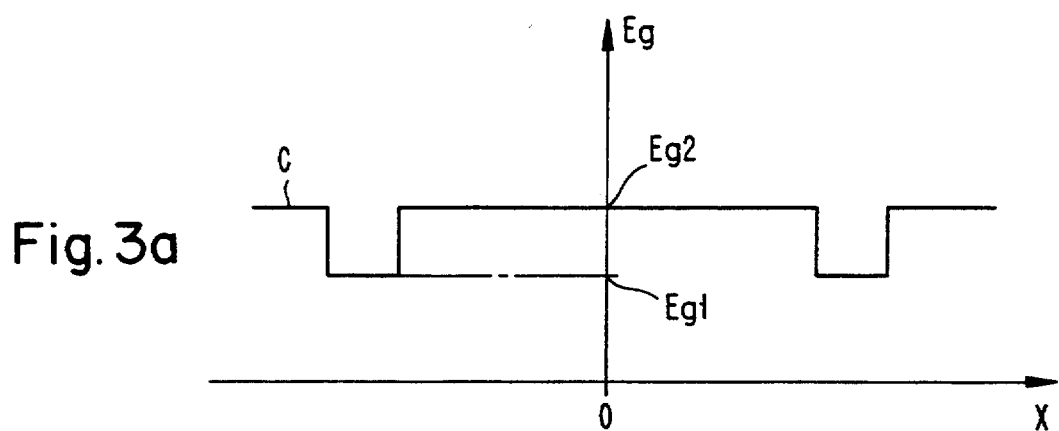
FIG. 3a is a diagram relating to the switch, in the absence of a control signal.
Figure 3B:
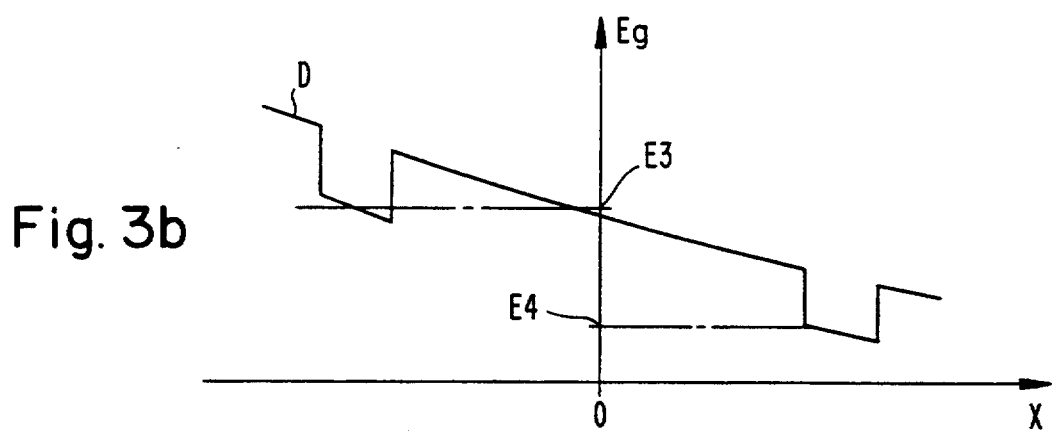
FIG. 3b is a diagram relating to the switch, with a control signal applied.

The operating mode of the inventive switch will now be described with reference to FIGS. 3a and 3b in the case when the transported electrons are subjected to a certain degree of scattering and electron transportation is not therefore totally ballistic. The electron waveguides 2 also have several propagation modes. The semiconductor materials in the switch have, in a known manner, separate energy bands, a valence band and a conduction band respectively. The curve C in FIG. 3a shows an energy difference between these bands, the bandgap. The abscissa Eg in FIG. 3a identifies a band energy, and the ordinate X in FIG. 3a identifies a lateral distance transversely of the electron waveguides 7 and 8 shown in FIG. 2. (The same axes are used in FIGS. 3b, 4a, and 4b, which are further described below.) In a non-influenced state, the bottom of the conduction band of the GaAs electron waveguides 2 are at an energy level Eg1 which is lower than a corresponding energy level Eg2 for the GaAlAs layers 13, 14. The energy difference is Eg2−Eg1=0.3 eV for the materials chosen in the illustrated embodiment. Electrons in the waveguides 2 are prevented from spreading out in the substrate by the potential depressions created by the smaller bandgap of the waveguides. The potential depressions are shown for the outgoing waveguides 7 and 8 in the illustrations of FIGS. 3a and 3b. The electric field E influences the materials in the switch and displaces the energy levels, as shown by a curve D in FIG. 3b. With the field E directed in the manner shown in FIG. 2, the band edge of the conduction band of the outgoing electron waveguide 7 is displaced to a level E3 that is higher than a level E4 for the electron waveguide 8. As mentioned above, the case in which the electrons are subjected to a certain amount of scattering during their transportation in the waveguides 2 is considered. In this case, the electrons will relax from an incoming energy level down to a lower energy level as they travel through the electron waveguide 6 and the connection region 9. These electrons will have a larger probability to be conducted through the outgoing electron waveguide that has the lowest potential controlled by electrodes 10 and 11, in the illustrated embodiment through the electron waveguide 8. When the electric field E is sufficiently strong, essentially all electrons from the incoming electron waveguide 6 will be conducted through the outgoing waveguide 8.

Figure 4A:
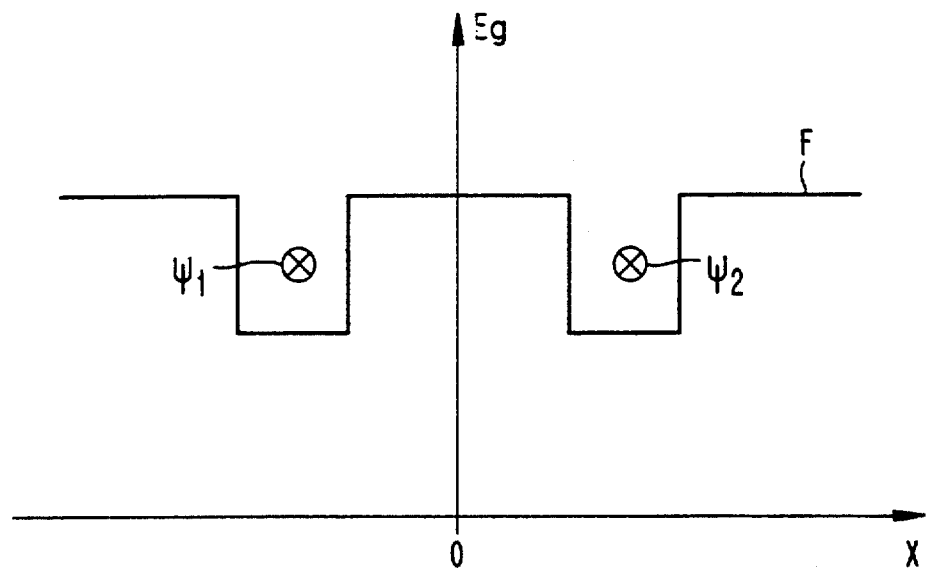
FIG. 4a is a diagram relating to the switch with single-mode propagation, in the absence of a control signal.

The case in which electron transportation is totally ballistic will now be explained with reference to FIGS. 4a and 4b. In this case principally one or more propagation modes are permitted in the electron waveguides 2. Below the single mode case is described. An electron wave function Ψ in the incoming waveguide 6 is divided, in the absence of the electric field E, into two equal electron wave functions Ψ₁ and Ψ₂ in the two outgoing waveguides 7 and 8 respectively according to FIG. 1. This means that on average an equal number of electrons can be detected in the two electron waveguides. The potential of these two electron waveguides is given by curve F in FIG. 4a, in which the electron wave functions Ψ₁₂Ψ, are also shown schematically. When the electric field E is applied, a changed potential is obtained, as shown by the curve G in FIG. 4b. The electron wave functions Ψ₁ and Ψ₂ in the two outgoing electron waveguides 7 and 8 have the same total energy level E5, because electron transportation is ballistic. Switching takes place in the following manner. A wave vector $k_z$ according to the relationship $k_z = p_z/$  is assigned to the electron impulse $p_z$ in the z-direction of propagation. This vector $k_z$ has different values in the two electron waveguides 7 and 8 in the direction of propagation of the wave functions. The vectors differ according to the relationship $$\Delta(k_z^2) = \frac{2m^*}{^2} \Delta V$$

Figure 4B:
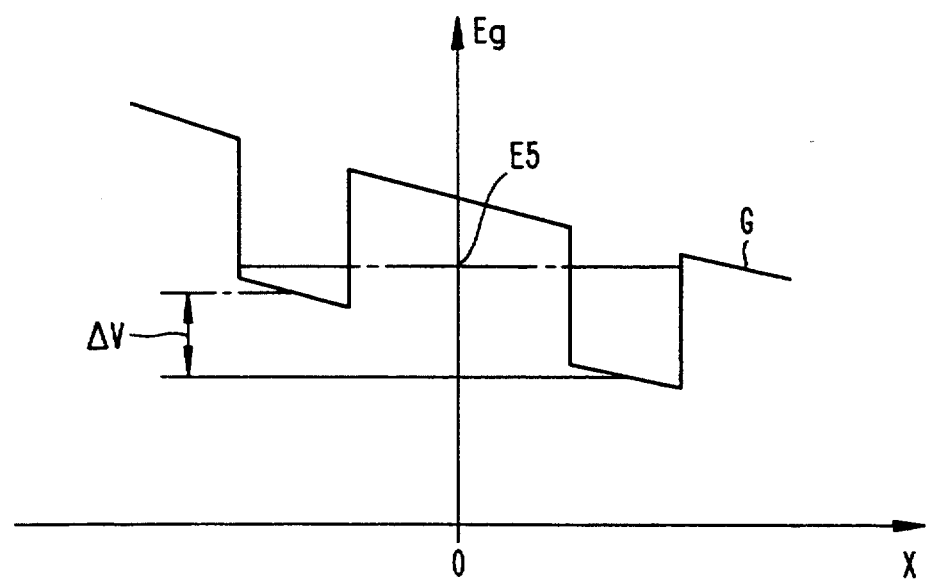
FIG. 4b is a diagram relating to the switch in the case of single-mode propagation, with a control signal applied.

In this relationship, $\Delta(k_z^2)$ represents the difference in magnitude of the vectors $k_z$ in the waveguides 7 and 8, $m^*$ is the effective mass of the electrons,  $=h/2\pi$, where h is Planck's constant, and $\Delta V$ is a potential difference illustrated in FIG. 4b. The difference in the magnitude of the $k_z$-vectors is a measurement of a phase mismatch between the outgoing electron waveguides 7 and 8. The incoming electron wave function Ψ in the electron waveguide 6 has, as before mentioned, only one propagation mode, the only propagation mode that is permitted, which in space dimensions has even parity. The electron wave function Ψ tries to maintain its parity in the electron waveguides 2 and couples to the quasi even electron wave function Ψ₁ or Ψ₂ in that one of the electron waveguides 7 or 8 which has the lowest potential. This coupling between the wave functions takes place essentially in the connection region 9, and the switching becomes more pronounced the greater the potential difference ΔV, in other words the stronger the electric field E. These switching properties are described in more detail below with reference to FIG. 5. Switching between the modes of the electron wave functions is highly insensitive to the energies of the incoming electrons, and the switch functions for a broad spectrum of incident electron energies.

In the two cases described above, the electron wave is switched to that one of the outgoing electron waveguides 7 or 8 which presents the lowest potential to the electrons. It should be carefully noted, however, that switching takes place for different reasons in the two cases. In the first mentioned case, in which the electrons are scattered, the energy of the electrons is not preserved and the stream of electrons flow in the waveguide of lowest potential, for energetic reasons. In the second case in which electron transportation is totally ballistic, in the absence of electron scattering, switching is considered as a pure wave propagation problem for the electron wave function Ψ. The parity of this wave function is preserved and one or more propagation modes are permitted for the electron wave function in the electron waveguides 2. The boundary between the two operational cases is not well defined in practice, and both operational cases may occur simultaneously in one and the same switch.

In the case of the embodiment illustrated in FIGS. 1 and 2, the waveguides 2 and the substrate 1 are made of mutually different materials. It is also possible, however, to delimit an electron waveguide in a substrate with the aid of an electric field. In this case, the width of the electron waveguides can be influenced with the aid of said electric fields, in a manner to obtain a single-mode waveguide or a multi-mode waveguide for the electron wave function.

In the latter operational case with ballistic transportation of the electron, no dissipation of energy takes place in the switch. In the former case in which the electrons spread, a certain, small amount of heat is generated in the switch, which is disadvantageous for the following reasons. Mesoscopic components are extremely small and it is possible to integrate a large number of such components on a common substrate. A significant amount of energy may be developed within a limited volume, requiring cooling of the components.

Figure 5:
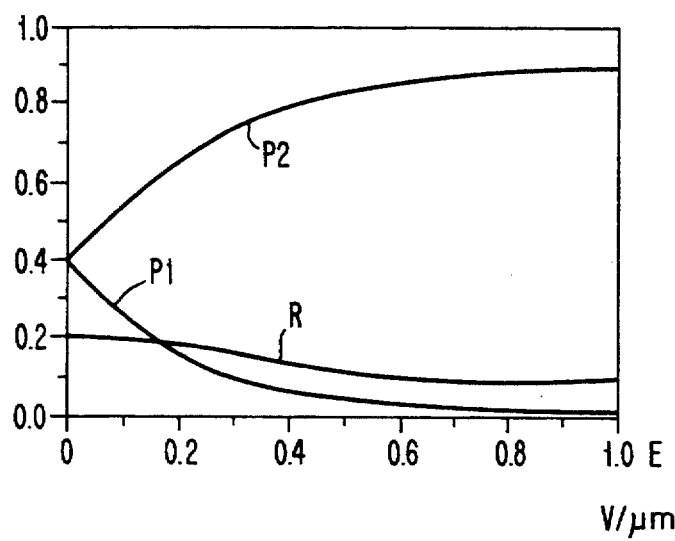
FIG. 5 is an input-output diagram relating to the switch.

FIG. 5 is a computer simulated diagram showing an input-output characteristic for the inventive switch in the single-mode propagation case. The input signal is the electric field E from the electrodes 10 and 11, which is plotted on the abscissa of the diagram. The incoming electron wave function $\Psi$ has a power P0 which is divided and delivered from the outgoing electron waveguides 7 and 8 as electron wave functions $\Psi_1$ and $\Psi_2$ having the powers P1 and P2 respectively (see FIG. 1). The powers are measured as the squares of the magnitude of the electron wave functions. The power P0 is normalized to 1.0 and is given on the ordinate of the diagram and the characteristics are given with curves for the powers P1 and P2. A curve R shows reflected energy in the branch. It will be seen from the diagram that the switch is digital insomuch that an output signal 0 or 1 is obtained when the magnitude of the input signal E exceeds a given value, in the diagram a value of about 0.5 V/$\mu$m. This value corresponds to a voltage difference of about 0.10 V between the electrodes 10 and 11 of the switch shown in FIG. 1.

A brief description will now be given of the manner in which the inventive component illustrated in FIGS. 1 and 2 is produced. The planar layers 13 and 14 shown in FIG. 2 can be produced by growing semiconductor materials epitaxially. This technique is well established, and can be used to grow a layer of, e.g., 50 Å thickness for the waveguides 2. Semiconductor layers of this thickness are found, for instance, in so-called quantum well lasers and also in other optical components based on lasers of this kind. Lateral confinement of the waveguides for the purpose of enclosing the electron wave function causes certain difficulties, although a number of methods are known.

M. Notomi, et al, disclose in Applied Physics Letters, Vol. 58, (1991), p. 720 and following, a layer etching and regrowing method. This method can be used in the production of the switch illustrated in FIG. 2, where the electron waveguides 7 and 8 have been produced by an etching method, so-called mesa etching, and the layer 14 is a regrown layer.

N. Dagli, et al, disclose in Journal of Applied Physics, Vol. 69, January 1991, p. 1047, a method of confining the electron waveguides with the aid of electric fields in an article: "An electron wave directional coupler and its analysis".

Atomic growth of quantum waveguides as described by P.M. Petroff in an article "Novel approaches in 2 and 3 dimensional confinement structures: processing and properties" in the Journal Superlattices and Microstructures vol. 8, no. 1, p 35–39 University of California, Santa Barbara, 1990.

The use of strain-induced confinement of the electron waveguides is also possible.

It can be said with regard to the electron waveguides that the narrower the waveguides the greater the lateral potential step that can be accepted without the waveguides becoming multi-mode waveguides. Conversely, if, for some practical reason or other, the waveguides must be made broader, for instance broader than 50 nm, it is necessary for the potential step to be small for the electron waveguides to be single-mode waveguides. In turn, it is necessary for the switch device to have a low temperature in order to prevent scattering of the charge carriers from the electron waveguides.

Figure 6:
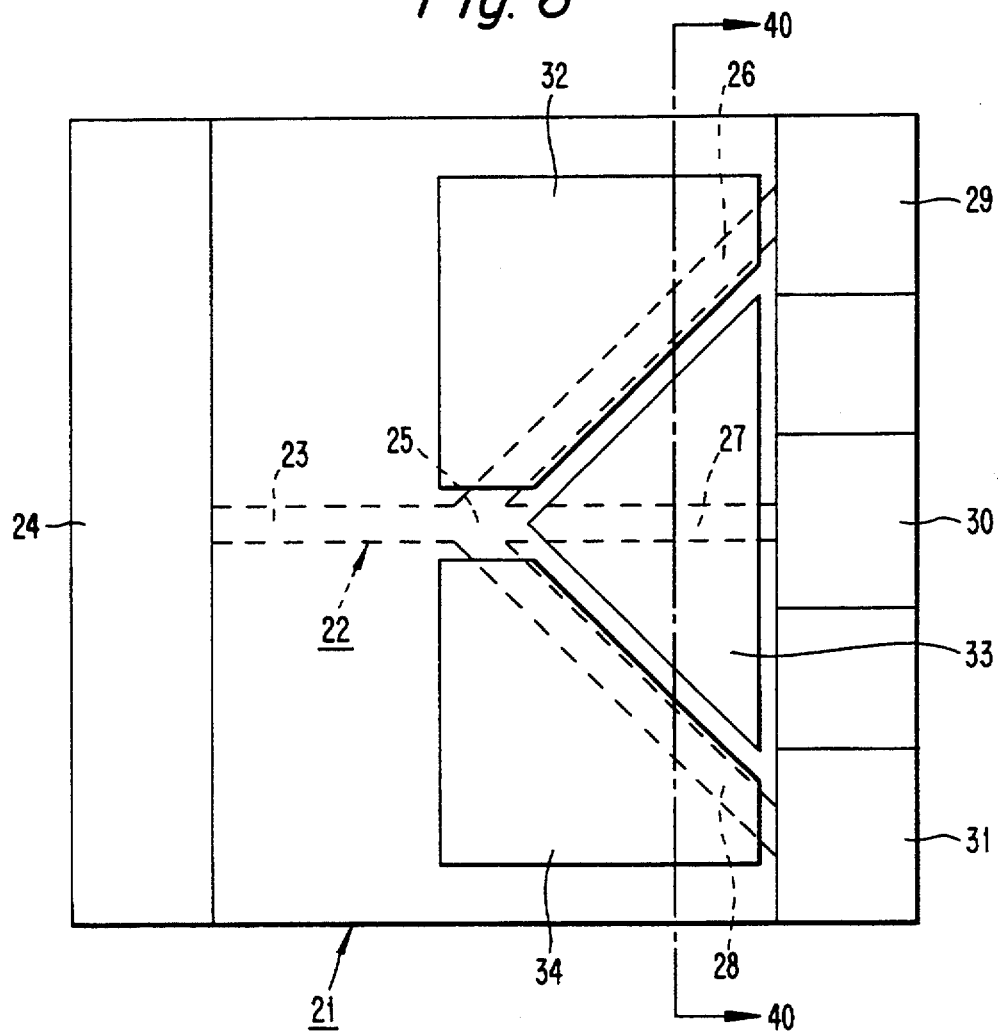
FIG. 6 is a top view of an alternative embodiment of the switch.
Figure 7:
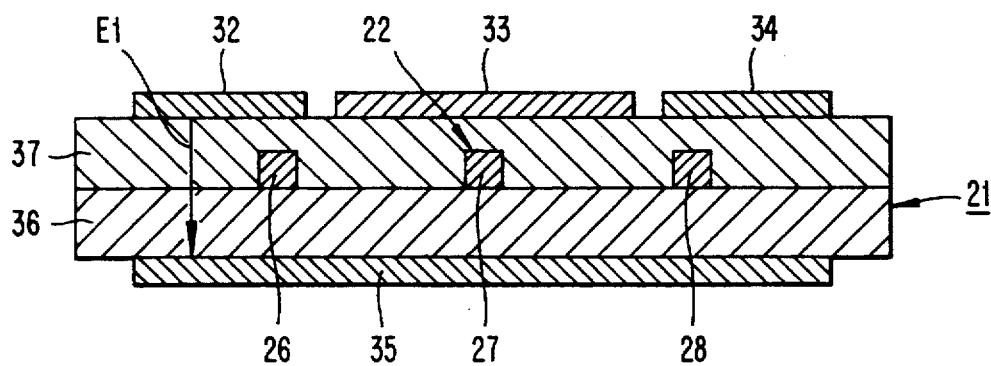
FIG. 7 is a cross-sectional view of the switch shown in FIG. 6.

An alternative embodiment of the invention is illustrated in FIGS. 6 and 7. This embodiment includes a substrate 21 made of InP (indium phosphide) and having InGaAsP (indium gallium arsenide phosphide) electron waveguides 22, which cannot be seen in the view of FIG. 6 and which are therefore shown in broken lines. The electron waveguides include an incoming electron waveguide 23, which is connected at one end to an electron reservoir 24 and at its other end to a connection region 25 as seen in FIG 6. Extending from this connection region are three outgoing electron waveguides 26, 27 and 28 which are arranged in a forked configuration and each of which is connected to a respective electron reservoir 29, 30 and 31 as seen in FIG. 6. These reservoirs are electrically isolated from each other and electrons are driven from the reservoir 24 through the electron waveguides 22 to the reservoirs 29, 30 and 31 with the aid of voltage sources not shown. Electrons in the incoming electron waveguide 23 are switched to one of the outgoing electron waveguides 26, 27 or 28 with the aid of electrodes 32, 33, 34 and 35, shown in FIG. 7. FIG. 7 is a cross-sectional view of the switch illustrated in FIG. 6, taken on the line 40—40 in FIG. 6. The substrate 21 includes a bottom layer 36 which carries the waveguides 22 as seen in FIG. 7. These waveguides are covered by a top layer 37 which carries the electrodes 32, 33 and 34 as seen in FIG. 7. The electrode 35 is mounted on the undersurface of the bottom layer 36. Voltage sources (not shown) are connected between the electrode 35 and the electrodes 32, 33 and 34 and generate an electric field E1, which in FIG. 7 is shown to extend between the electrodes 32 and 35. The field E1 changes the potentials of the outgoing electron waveguides 26, 27 and 28 and controls an electron flow in the electron waveguides 22. This control is effected in a manner corresponding to that described with reference to FIGS. 1–5 above.

Figure 8:
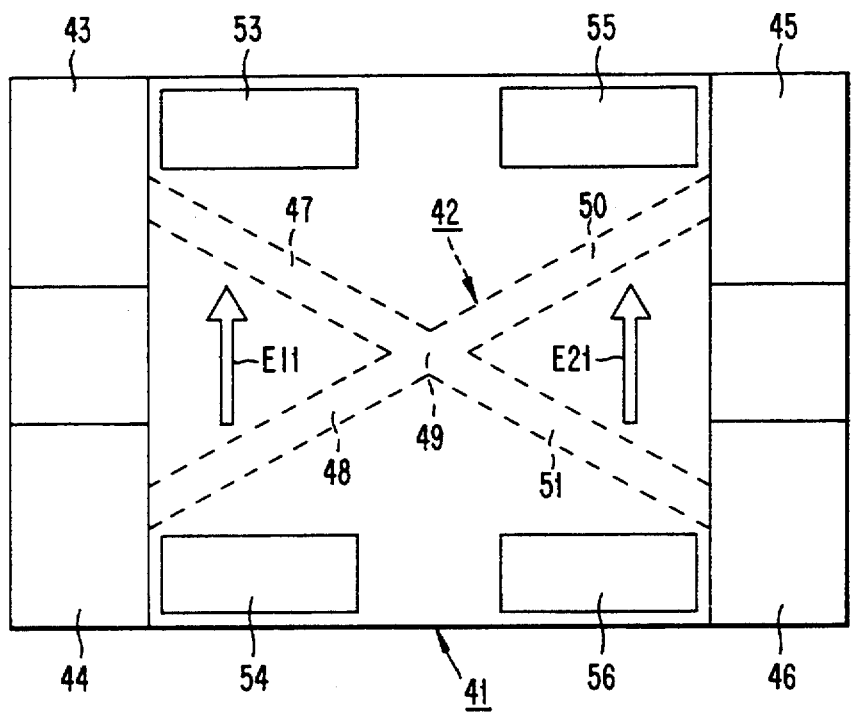
FIG. 8 illustrates a further alternative embodiment of the invention.
Figure 8A:
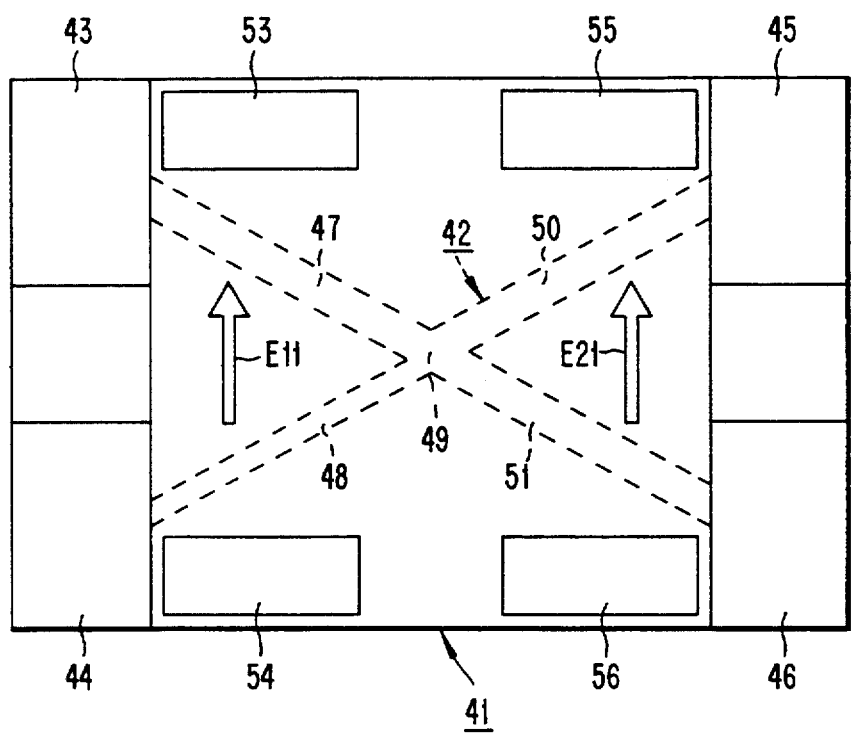
FIG. 8a illustrates another alternative embodiment of the invention.

A further embodiment will be described briefly with reference to FIG. 8. In this embodiment, a substrate 41 has electron waveguides 42 and electron reservoirs 43, 44, 45, 46. The electron waveguides include two incoming electron waveguides 47 and 48, each of which is connected to a respective electron reservoir 43 and 44. The electron waveguides 47 and 48 are connected to a common connection region 49, to which two outgoing electron waveguides 50 and 51 are also connected. These two electron waveguides branch in a forked fashion and are each connected to a respective electron reservoir 45 and 46. Mounted on the upper surface of the substrate 41 are electrodes 53, 54, 55, 56 by means of which electric fields E11 and E21 respectively can be generated. Electrons incoming in either of the incoming electron waveguides 47 or 48 can be switched between the outgoing electron waveguides 50 and 51, with the aid of the electrodes 53–56. The switch illustrated in FIG. 8 is constructed generally in the same way as the switch illustrated in FIG. 1 and operates in the same way as said switch. The only difference between the two embodiments is that the embodiment according to FIG. 8 has two inputs. The electric field E11 creates an asymmetry between the incoming electron waveguides 47 and 48. It should be noted that this asymmetry can be placed permanently on the input side, for instance by giving the electron waveguides 47 and 48 different widths, as illustrated in FIG. 8a which is otherwise identical to FIG. 8.

The above-described switches are made from semiconductor material. It is possible, however, to produce the switches from other types of material, for instance from electrically conductive polymeric materials.

Mesoscopic components have several advantages over conventional electronic components, in that they require only small control signals as described above, among other things. The components may be switched while generating only a small amount of energy, for instance some few eV as compared with 1000 eV in the case of the most advanced conventional electronic components known hitherto, at room temperature. Furthermore, the ballistic transportation of the electrons results in extremely rapid components, and switching in the THz-range would appear to be within reach. The inventive switch also has advantages over known mesoscopic components. As explained above, the inventive switch is digital and will function to switch electrons within a broad energy range, and the switch does not require single mode waveguides.

I claim:

1. A quantum wave guiding electronic switch comprising:
   a substrate;
   a plurality of electron waveguides disposed on the substrate;
   electrodes disposed on the substrate beside the electron waveguides for generating an electric field in a direction transverse to the electron waveguides in response to an electrical voltage applied thereto; and
   electron reservoirs disposed on the substrate and between which the electron waveguides extend;
   wherein the electron waveguides have lengths in the transverse direction that are of the same order of magnitude as a wavelength of an electron wave function in the electron waveguides, wherein
   the electron waveguides are disposed in a fork-like configuration, with at least one incoming electron waveguide which is connected in a connection region to at least two outgoing electron waveguides;
   the electron waveguides have lengths in a longitudinal direction which have a magnitude that is less than or approximately equal to a magnitude of a coherence length of the electron wave function in the electron waveguides;
   the incoming and the outgoing electron waveguides are each connected to a respective one of the electron reservoirs, said reservoirs being isolated electrically from one another; and
   the electrodes are disposed beside at least the outgoing electron waveguides, wherein when the electric field is passed through at least one of the outgoing electron waveguides, a phase mismatch of the electron wave function results, so that electrons in the incoming electron waveguide will be switched to substantially only the particular outgoing electron waveguide which has a lowest energetic potential.

2. A switch according to claim 1, wherein the plurality of electron waveguides includes at least two incoming electron waveguides.

3. A switch according to claim 2, wherein the electrodes are disposed on a side of the substrate beside the forklike disposed electron waveguides.

4. A switch according to claim 2, wherein the length in transverse direction of one of the incoming electron waveguides is greater than the length on the transverse direction of an other of the incoming electron waveguides.

5. A switch according to claim 4, wherein the electrodes are disposed on a top and bottom of the substrate beside at least on of the outgoing electron waveguides.

6. A switch according to claim 4, wherein the electrodes are disposed on a side of the substrate beside the forklike disposed electron waveguides.

7. A switch according to claim 2, wherein the electrodes are disposed on a top and bottom of the substrate beside at least one of the outgoing electron waveguides.

8. A switch according to claim 1, wherein the electrodes are disposed on a top and a bottom of the substrate beside at least one of the outgoing electron waveguides.

9. A switch according to claim 1, wherein the electrodes are disposed on a side of the substrate beside the forklike disposed electron waveguides.

10. A switch according to claim 1, wherein the switch includes one incoming electron waveguide and two outgoing electron waveguides; and the electrodes are disposed on a side of the substrate on a respective side of the outgoing electron waveguides.

11. A quantum wave guiding electron switch comprising:
    a substrate;
    a plurality of electron waveguides disposed on the substrate;
    electrodes disposed on the substrate beside the electron waveguides for generating an electric field in a direction transverse to the electron waveguides in response to an electrical voltage applied thereto; and
    electron reservoirs disposed on the substrate and between which the electron waveguides extend;
    wherein the electron waveguides have lengths in the transverse direction that are of the same order of magnitude as a wavelength of an electron wave function in the electron waveguides, wherein
    the electron waveguides are disposed in a fork-like configuration with at least one incoming electron waveguide which is connected in a connection region to at least two outgoing electron waveguides;
    each of the incoming and the outgoing electron waveguides is connected to a respective one of the electron reservoirs, said reservoirs being isolated electrically from one another;
    the electrodes are disposed beside at least the outgoing electron waveguides, wherein when the electric field is passed through at least one of the outgoing electron waveguides, energy levels of the electron waveguides are displaced, so that energy levels of electrons in the incoming electron waveguide decrease and the incoming electrons switch to substantially only the particular outgoing electron waveguide which has a lowest energetic potential when the electrons propagate in a multimode fashion.

12. A switch according to claim 11, wherein the electrodes are disposed on a side of the substrate beside the forklike disposed electron waveguides.

13. A switch according to claim 11, wherein the electrodes are disposed on a top and a bottom of the substrate beside at least one of the outgoing electron waveguides.

14. A switch according to claim 11, wherein the plurality of electron waveguides includes at least two incoming electron waveguides.

15. A switch according to claim 14, wherein the length in the transverse direction of one of the incoming electron waveguides is greater than the length in the transverse direction of an other of the incoming electron waveguides.

16. A switch according to claim 11, wherein the switch includes one incoming electron waveguide and two outgoing electron waveguides; and the electrodes are disposed on a side of the substrate and on a respective side of the outgoing electron waveguides.

* * * * *